(12) United States Patent
Houston

(10) Patent No.: US 6,677,190 B1
(45) Date of Patent: Jan. 13, 2004

(54) SELF-ALIGNED BODY CONTACT IN A SEMICONDUCTOR DEVICE

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 11 days.

(21) Appl. No.: 10/230,830

(22) Filed: Aug. 29, 2002

(51) Int. Cl.[7] ............................................. H01L 21/00
(52) U.S. Cl. ...................................... 438/149; 257/349
(58) Field of Search ........................... 438/149; 257/349

(56) References Cited

U.S. PATENT DOCUMENTS 5,962,895 A * 10/1999 Beyer et al. ................. 257/347
6,387,739 B1 * 5/2002 Smith, III .................... 438/157
6,509,613 B1 * 1/2003 En et al. ...................... 257/349

* cited by examiner

Primary Examiner—David Nelms
Assistant Examiner—Quoc Hoang (57) ABSTRACT

A method of forming an electrical contact is provided. The method includes forming a gate dielectric layer adjacent a body region of a transistor structure and forming a layer of dielectric material at least partially defining a trench adjacent the body region. The method further includes forming a conductive layer extending into the trench. The method further includes removing a region of the portion of the conductive layer extending into the trench to expose a region of the gate dielectric layer. The method further includes removing the exposed region of the gate dielectric layer to expose a contact portion of the body region. The method further includes filling the trench with a gate material such that a contact portion of the gate material is in direct contact with the contact portion of the body region.

25 Claims, 8 Drawing Sheets

SELF-ALIGNED BODY CONTACT IN A SEMICONDUCTOR DEVICE

TECHNICAL FIELD OF THE INVENTION

This invention relates in general to semiconductor devices and, more particularly, to a self-aligned body contact in a semiconductor device.

BACKGROUND OF THE INVENTION

In integrated circuit fabrication, conductive contacts are often formed to connect particular regions or components of the integrated circuit. For example, such conductive contacts may be used to apply a voltage to a particular region or component of the integrated circuit. In some applications, it is desirable to control the voltage of the channel, or body region, below the gate of a transistor structure. For example, it may be desirable to control the body voltage of the body in order to control the threshold voltage of the transistor in order to reduce leakage current in a memory array.

In order to control the body voltage, a conductive path must be formed from the source of the current to the body of the transistor structure. For example, a contact to the body may be formed during fabrication of the transistor structure.

SUMMARY OF THE INVENTION

In accordance with the present invention, a self-aligned body contact in a semiconductor device is provided that substantially eliminates or reduces the disadvantages and problems associated with previously developed body contacts.

According to one embodiment, a method of forming an electrical contact is provided. The method includes forming a gate dielectric layer adjacent a body region of a transistor structure and forming a layer of dielectric material at least partially defining a trench adjacent the body region. The method further includes forming a conductive layer extending into the trench. The method further includes removing a region of the portion of the conductive layer extending into the trench to expose a region of the gate dielectric layer. The method further includes removing the exposed region of the gate dielectric layer to expose a contact portion of the body region. The method further includes filling the trench with a gate material such that a contact portion of the gate material is in direct contact with the contact portion of the body region.

According to another embodiment, another method of forming an electrical contact is provided. The method includes forming a gate dielectric layer adjacent a body region of a transistor structure and forming a layer of dielectric material at least partially defining a trench adjacent the body region. The method further includes forming a layer of gate material extending into the trench. The method further includes removing a region of the gate material extending into the trench to form a cavity and expose a region of the gate dielectric layer. The method also includes removing a portion of the gate dielectric layer to expose a contact portion of the body region. The method further includes filling the cavity with a contact material such that a contact portion of the contact material is in direct contact with the contact portion of the body region.

According to yet another embodiment, a semiconductor device is provided. The semiconductor device comprises a body region adjacent at least one active region, a gate proximate the body region, and a gate dielectric layer. The gate dielectric layer is disposed between the gate and the body region such that a first portion of the body region is separated from a first portion of the gate and a second portion of the body region is in direct contact with a second portion of the gate.

Various embodiments of the present invention may benefit from numerous technical advantages. It should be noted that one or more embodiments may benefit from some, none, or all of the advantages discussed below.

One technical advantage of the invention is that a gate-to-body contact in a transistor structure may be self-aligned with the trench used to form the transistor gate, such as a transistor gate formed using a damascene process. This provides an advantage over other contacts that are often difficult to align as desired.

Another technical advantage is that in some embodiments, the gate-to-body contact is formed entirely within the gate region and thus takes up little or no additional space in the transistor structure or integrated circuit, which saves valuable space in the integrated circuit. This may reduce the size and/or cost of fabricating an integrated circuit having one or more gate-to-body contacts. Thus, the gate-to-body contact formed within the gate region provides an advantage over contacts that are formed outside the gate region.

Another technical advantage is that sidewalls may be formed in order to provide separation between the gate-to-body contact and the active source and drain regions. This may reduce or eliminate the possibility of electrical shorting caused by the active source or drain regions.

Still another technical advantage is that a general body contact may be formed which may be used to connect the body region of the transistor structure to various components of the transistor structure or the integrated circuit in which the transistor structure is formed. The body contact may be self-aligned with the trench used to form the transistor gate. In addition, the body contact may be formed entirely within the gate region, which may reduce the size and/or fabrication costs of an integrated circuit utilizing one or more body contacts, as discussed above.

Other technical advantages will be readily apparent to one having ordinary skill in the art from the following figures, descriptions, and claims.

BRIEF DESCRIPTION OF THE DRAWINGS

For a more complete understanding of the present invention and for further features and advantages, reference is now made to the following description, taken in conjunction with the accompanying drawings, in which.

DETAILED DESCRIPTION OF THE DRAWINGS

Example embodiments of the present invention and their advantages are best understood by referring now to FIG. 1A through 8D of the drawings, in which like numerals refer to like parts.

In general, several methods of forming self-aligned gate-to-body contacts between the gate and body regions of a transistor structure are provided. The gate-to-body contacts may be used to apply a voltage from the gate to the body region, such as to control the threshold voltage of the transistor structure. In some embodiments, sidewalls are formed to separate the gate-to-body contact from the active source and drain regions of the transistor structure such that current running through the gate and body region will not be shorted by the source or drain regions. The gate-to-body contact may be formed entirely within the gate region of the transistor structure, which saves valuable space in the integrated circuit. In addition, a general body contact is provided which may be used to provide a connection between the body region and various other regions or components of the integrated circuit. The body contact may be insulated from the gate by an insulating sidewall.

Figure 1A:
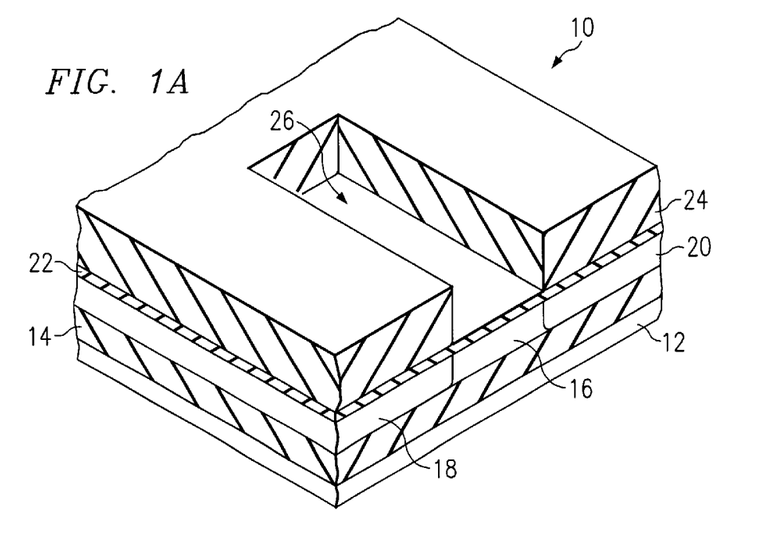
FIGS. 1A through 1E are partial three-dimensional views illustrating a method of forming a gate-to-body contact in a transistor structure using a conductive liner in accordance with an embodiment of the present invention.

FIG. 1A through 1E illustrate a method of forming a gate-to-body contact in accordance with an embodiment of the present invention. As shown in FIG. 1A, a transistor structure 10 for a silicon on insulator (SO) transistor includes a substrate 12, a layer of buried oxide (BOX) 14, and a body region 16 (which may also be referred to as a channel 16) disposed between an active source region 18 and an active drain region 20. Substrate 12 may be formed from silicon, gallium arsenide, or any other material suitable to form a substrate for a semiconductor device or integrated circuit. Active source and drain regions 18 and 20 may be formed using known doping methods.

Transistor structure 10 also includes a gate dielectric layer 22 disposed adjacent body region 16 and active source and drain regions 18 and 20. Gate dielectric layer 22 may comprise silicon dioxide or any other material suitable for forming a gate dielectric layer. A dielectric layer 24 may be formed adjacent gate dielectric layer 22, and may include a trench 26. Trench 26 may be typically formed to receive a gate material to form a gate (such as gate 48 discussed below) adjacent body region 16. Dielectric layer 24 may comprise any suitable dielectric material, such as silicon nitride, aluminum nitride, or boron nitride, for example.

Dielectric layer 24 and trench 26 may be formed in a variety of ways. For example, dielectric layer 24 may be deposited adjacent gate dielectric layer 22 and trench 26 may be formed by patterning and etching dielectric layer 24, such as in a damascene approach. As another example, dielectric layer 24 having trench 26 may be formed by depositing a layer of gate material adjacent gate dielectric layer 22, patterning and etching the gate material to form a gate structure, depositing dielectric material around the gate structure, and removing the gate material to form trench 26. As yet another example, a process similar to the previous example may be performed using a temporary or dummy material instead of the gate material.

Figure 1B:
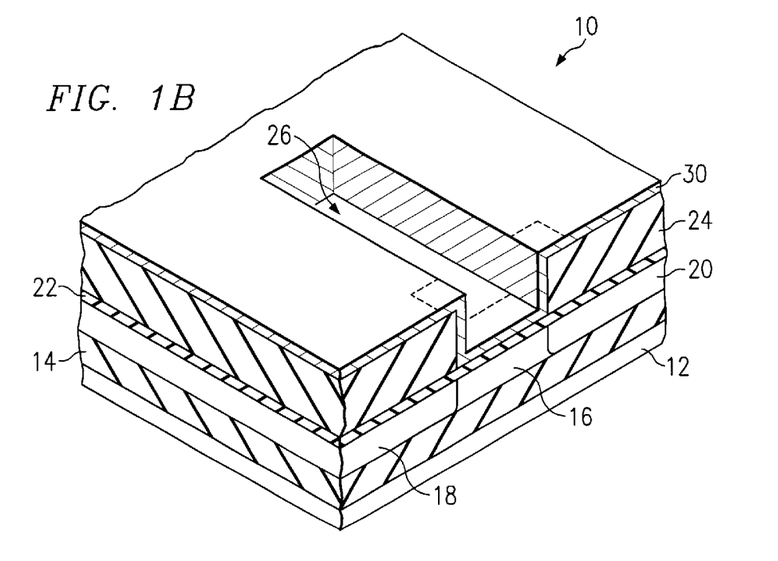

As shown in FIG. 1B, a conductive layer, or liner, 30 is deposited over dielectric layer 24 and extends into trench 26. Conductive layer 30 may comprise one or more conductive materials since conductive layer 30 forms a portion of the gate that is formed in trench 26, as discussed in greater detail below with respect FIG. 1E. For example, conductive layer 30 may comprise titanium, titanium nitride, tungsten, polysilicon, or amorphous silicon. In some embodiments, conductive layer 30 comprises the same material as the gate material to be deposited in trench 26; in other embodiments, conductive layer 30 comprises a different conductive material than the gate material. Conductive layer 30 may be formed using any standard deposition technique.

Figure 1C:
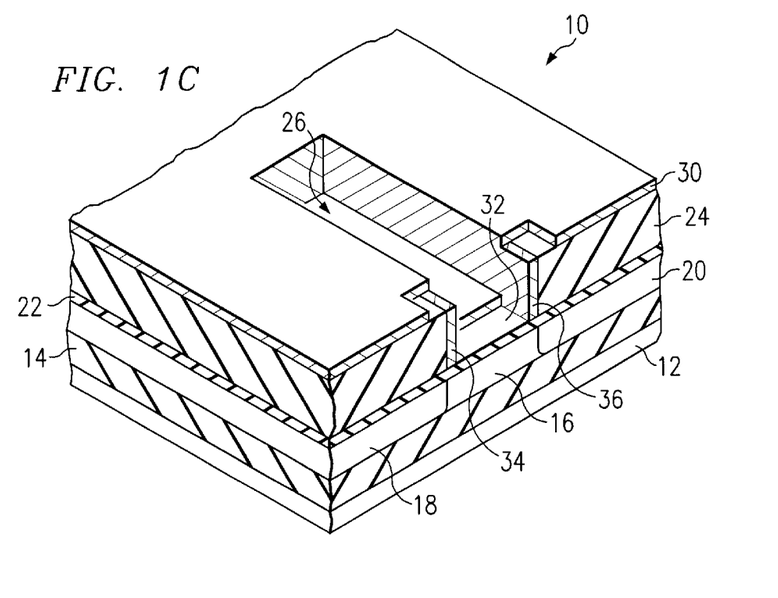

As shown in FIG. 1C, a portion of conductive layer 30 is removed to expose a region 32 of gate dielectric layer 22 and to form a first sidewall 34 and a second sidewall 36 on opposing sides of trench 26. For example, an area spanning across trench 26 may be patterned and etched using a vertical etch to remove regions of conductive layer 30 within and on each side of trench 26. A selective etch may be used that removes conductive layer 30 but not dielectric layer 24. Exposed region 32 may have a width 38 approximately equal to the distance between first sidewall 34 and second sidewall 36.

Figure 1D:
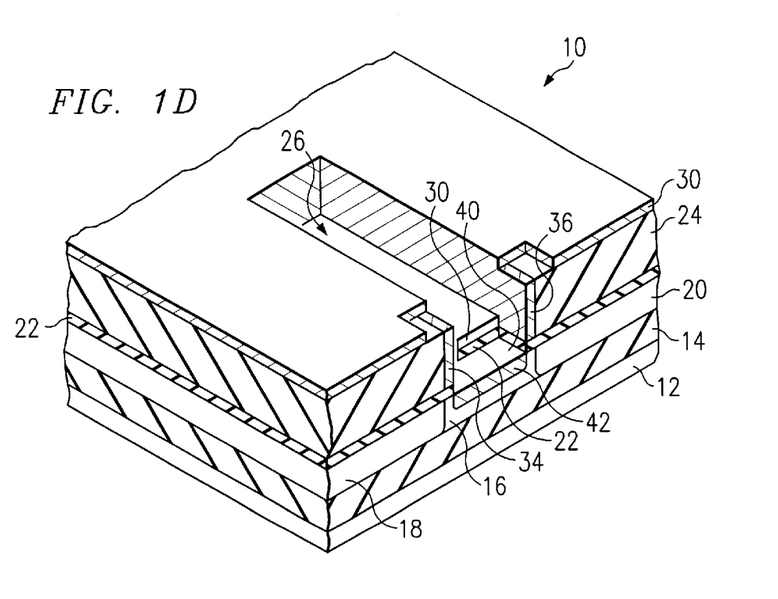

As shown in FIG. 1D, exposed region 32 of gate dielectric layer 22 is removed to expose a contact portion 40 of body region 16. Regions of gate dielectric layer 22 adjacent region 32, including regions of gate dielectric layer 22 within trench 26, may be protected from the etching of region 32 by conductive layer 30. In this manner, region 32 of gate dielectric layer 22 is removed, exposing contact portion 40 of body region 16. In some embodiments, contact portion 40 of body region 16 has a width approximately equal to width 38 of exposed region 32 of gate dielectric layer 22.

Contact portion 40 of body region 16 may be implanted with a dopant 42 to improve the electrical contact between body region 16 and the contact portion of the gate material, as discussed below with reference to FIG. 1E. For example, body region 16 may compromise p-type or n-type silicon having a particular dopant concentration and dopant 42 may be implanted in contact portion 40 of body region 16 to increase the dopant concentration of contact portion 40. For example, where body region 16 comprises p-type silicon, contact portion 40 may be implanted with a high concentration p-type dopant 42, such as high concentration boron, for example. Similarly, where body region 16 comprises n-type silicon, contact portion 40 may be implanted with a high concentration n-type dopant 42, such as high concentration arsenic or phosphorous, for example. In some embodiments, dopant 42 is not necessary for a sufficient contact between body region 16 and the contact portion of the gate material. For example, in one embodiment in which gate material 46 (discussed below with respect to FIG. 1E) comprises doped poly material, a sufficient contact may be provided between gate 48 and body region 16 without implanting a dopant into body region 16.

In some embodiments, such as the embodiment shown in FIGS. 1A through 1E, dopant 42 may be implanted directly into contact portion 40 after region 32 of gate dielectric layer 22 has been removed, such as shown in FIG. 1D. In an alternative embodiment, dopant 42 may be implanted into contact portion 40 through region 32 of gate dielectric layer 22 before region 32 has been removed. In yet another embodiment, dopant 42 may be implanted into contact portion 40 through both dielectric layer 24 and gate dielectric layer 22 before removing region 32 of gate dielectric layer 22 or the portion of dielectric layer 24 covering region 32. Dopant 42 may be implanted using a resist patterned according to the portion of body region 16 desired to be implanted.

Figure 1E:
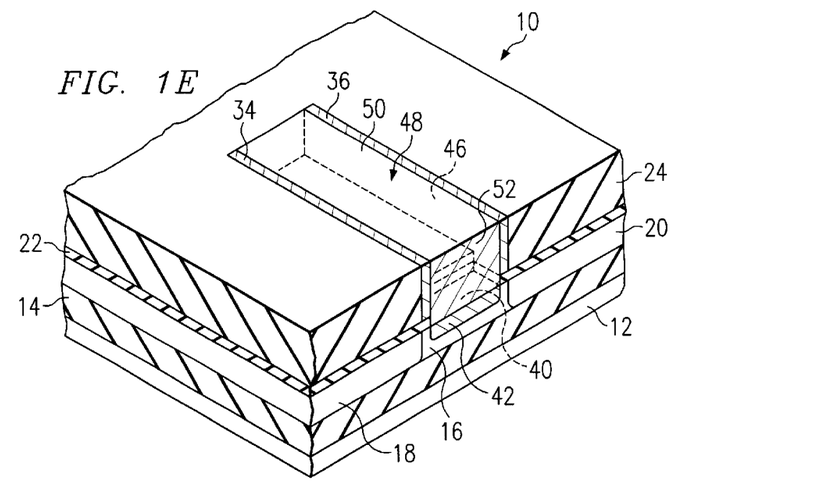

As shown in FIG. 1E, trench 26 may be filled with a gate material 46. For example, gate material 46 may be deposited into trench 26 using any suitable deposition technique. Gate material 46 may comprise one or more conductive materials suitable for use as a transistor gate, such as titanium, titanium nitride, tungsten, polysilicon, or amorphous silicon. In some embodiments, gate material 46 comprises the same material as conductive layer 30. In other embodiments, gate material 46 comprises a different material than conductive layer 30. In addition, transistor structure 10 may be planarized to remove portions of conductive layer 30 external to trench 26 and/or a portion of dielectric layer 24. Transistor structure 10 may be planarized using any standard planarization process, such as chemical mechanical polishing (CMP).

Together, gate material 46 and conductive layer 30 within trench 26 form a transistor gate 48. Gate 48 includes a first portion 50 that is separated from body region 16 by gate dielectric layer 22, and a contact portion 52 in direct contact with contact portion 40 of body region 16.

In this manner, an electrical gate-to-body contact is formed between contact portion 52 and contact portion 40. Thus, voltage may be applied to body region 16 via gate 48. For example, in some applications it is desirable to control the voltage of body region 16, which may be referred to as the body voltage or the back voltage, in order to control the threshold voltage of the transistor formed by transistor structure 10, thus reducing leakage current in a memory array. In some applications, turning the transistor on lowers the threshold voltage and turning the transistor off raises the threshold voltage.

In some embodiments, the gate-to-body contact between gate 48 and body region 16 is spaced away from active source and drain regions 18 and 20 such that the electrical connection between gate 48 and body region 16 is not shorted by active source region 18 or active drain region 20. In the embodiment shown in FIG. 1E, the gate-to-body contact is spaced away from active source and drain regions 18 and 20 by a distance approximately equal to the thickness of sidewalls 34 and 36, respectively.

In addition, according to the method shown in FIGS. 1A through 1E, the gate-to-body contact is self-aligned with the trench 26 used to form gate 48. This provides an advantage over other contacts that may be difficult to align as desired. In addition, in some embodiments, such as shown in FIGS. 1A through 1E, the gate-to-body contact is formed entirely within the gate region and thus takes up little or no additional space in the device, allowing for a smaller and less expensive device. This provides an advantage over contacts that are formed outside the gate region.

It should be understood that although FIGS. 1A through 1E illustrate an SOI transistor structure, the above description also applies to any other suitable type of transistor structure.

Figure 2:
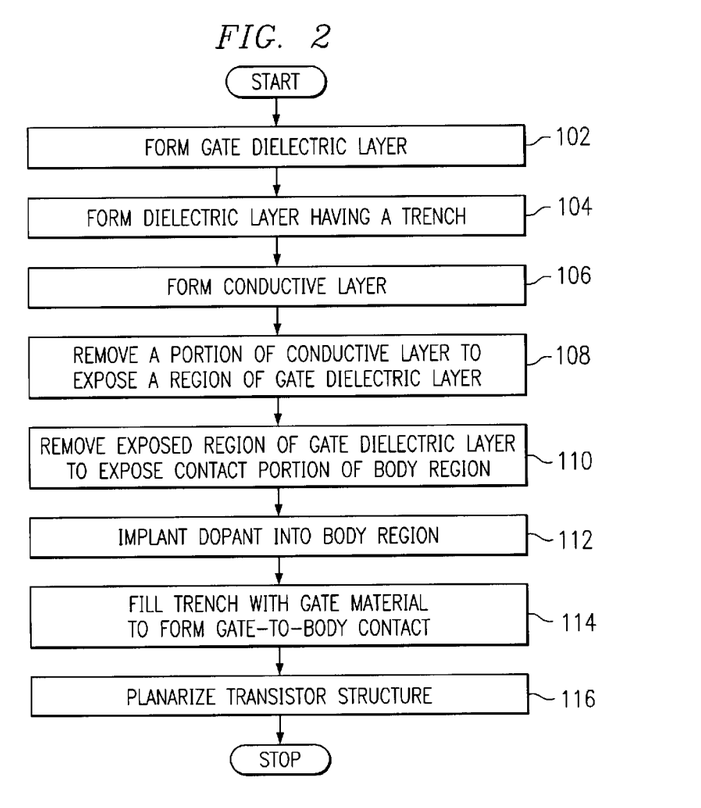
FIG. 2 is a flow chart illustrating the method of FIGURES 1A through 1E.

FIG. 2 illustrates a method of forming a gate-to-body contact in a transistor structure (for example, transistor structure 10). At step 102, a gate dielectric layer (for example, layer 22) is formed. At step 104, a dielectric layer (for example, dielectric layer 24) is formed having a trench (for example, trench 26) in which a gate (for example, gate 48) may be formed. In one embodiment, the dielectric layer is formed over the gate dielectric layer. In an alternative embodiment, the dielectric layer having the trench is formed and the gate dielectric layer is then formed in the trench.

At step 106, a conductive layer (for example, layer 30) is formed over the dielectric layer and extends into the trench. At step 108, the conductive layer is patterned and etched to remove a portion of the conductive layer, which exposes a region of the gate dielectric layer (for example, region 32 of gate dielectric layer 22, as shown in FIG. 1C). The pattern and etch of the conductive layer may also form a first sidewall and a second sidewall in the trench (for example, first sidewall 34 and second sidewall 36 in trench 26).

At step 110, a second pattern and etch process is performed to remove the exposed region of the gate dielectric layer, thus exposing a contact portion of a body region of the transistor structure (for example, contact portion 40 of body region 16, as shown in FIG. 1D). At step 112, the contact portion may optionally be implanted with a dopant (for example, dopant 42), which may increase the dopant concentration of the body region.

At step 114, the trench may be filled with a gate material (for example, gate material 46) such that the gate material and the conductive layer form a gate (for example, gate 48). The gate may include a gate contact portion (for example, contact portion 52) in direct contact with the contact portion of the body region such that an electrical contact is provided between the gate and the body region. The contact between the gate and the body region may be spaced away from active regions of the transistor structure (for example, active source and drain regions 18 and 20) such that the electrical connection between the gate and the body region is not shorted by the active regions. At step 116, the transistor structure is planarized to remove portions of the conductive layer and/or a portion of the dielectric layer.

Figure 3A:
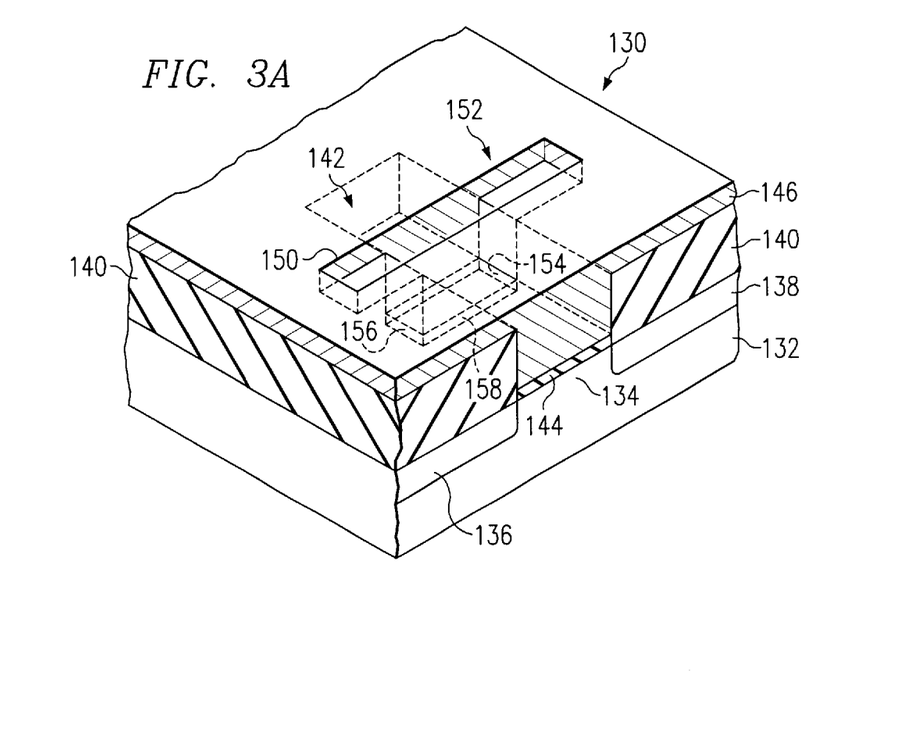
FIGS. 3A and 3B are partial three-dimensional views illustrating a method of forming a gate-to-body contact through the gate material in a transistor structure in accordance with an embodiment of the present invention.
Figure 3B:
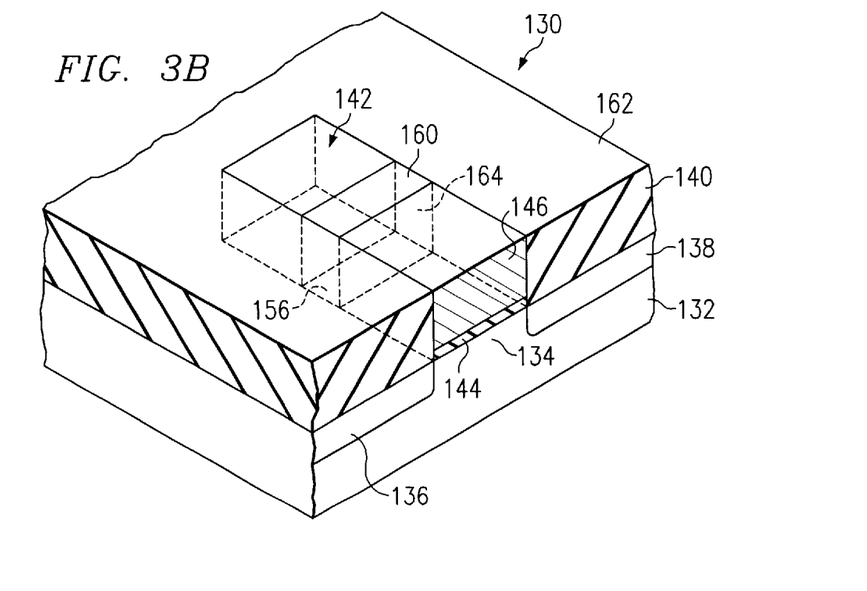

FIGS. 3A and 3B illustrate another method of forming a gate-to-body contact. In the embodiment shown in FIG. 3A, a transistor structure 130 includes a substrate 132 and a body region 134 disposed between an active source region 136 and an active drain region 138. Transistor structure 130 may be similar to transistor structure 10 described above. For example, transistor structure 130 may comprise an appropriate structure for an SOI transistor or any other type of transistor. Transistor structure 10 may also include a dielectric layer 140 having a trench 142, which may be similar to dielectric layer 24 and trench 26. A gate dielectric layer 144, which may be similar to gate dielectric layer 22, may be formed in trench 142. In an alternative embodiment, gate dielectric layer 144 may be disposed adjacent active source and drain regions 136 and 138, body region 134, and dielectric layer 140 may be disposed over gate dielectric layer 144, such as shown in the embodiment of FIGS. 1A through 1E.

A gate material 146, which may be similar to gate material 46, may be deposited over dielectric layer 140 and extend into trench 142, as shown in FIG. 3A. A pattern 150 may be used for etching gate material 146 and gate dielectric layer 144. In some embodiments, a stacked etch may be used to etch through gate material 146 and gate dielectric layer 144. For example, in one embodiment, a first etching process is used to remove a portion 152 of gate material 146 corresponding with pattern 150, and a second etching process is used to remove a portion 154 of gate dielectric layer 144 in trench 142 and corresponding with pattern 150. In another embodiment, a single etching process may be used to remove portion 152 of gate material 146 and portion 154 of gate dielectric layer 144. A contact portion 156 of body region 134 may be exposed by the removal of portion 154 of gate dielectric layer 144.

As shown in FIG. 3A, contact portion 156 of body region 134 may be implanted with a dopant 158 to improve the electrical contact between body region 134 and contact material 160 (discussed below with reference to FIG. 3B). Dopant 158 may be similar to dopant 42 discussed above with reference to FIG. 1D.

As shown in FIG. 3B, the opening formed by the patterning and etching process discussed above with reference to FIG. 3A is filled with contact material 160. Contact material 160 may be any suitable conductive material, and may comprise the same or different material as gate material 146. Transistor structure 130 may be planarized to remove portions of gate material 146 and contact material 160, and/or portions of dielectric layer 140 to form planarized surface 162.

Contact material 160 may include a contact portion 164 in direct contact with contact portion 156 of body region 134. In this manner, an electrical gate-to-body contact may be formed between contact portion 164 of contact material 160 and contact portion 156 of body region 34. Thus, voltage may be applied to body region 134 via gate material. 146 and contact material 160. In addition, the gate-to-body contact shown in FIG. 3B is self-aligned with trench 142 that is used to form the gate for transistor structure 130. In addition, in some embodiments, such as shown in FIGS. 3A–3B, the gate-to-body contact is formed entirely within the gate region and thus takes up little or no additional space in the device, allowing for a smaller and less expensive device. This provides an advantage over contacts that are formed outside the gate region.

Figure 4A:
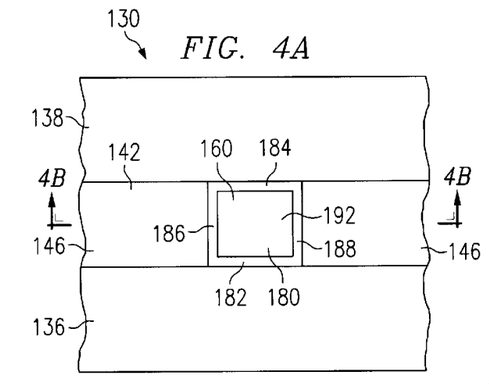
FIG. 4A is a top view of a transistor structure having a gate-to-body contact formed according to the method shown in FIGS. 3A and 3B, with the addition of sidewalls separating the gate-to-body contact from active source and drain regions.
Figure 4B:
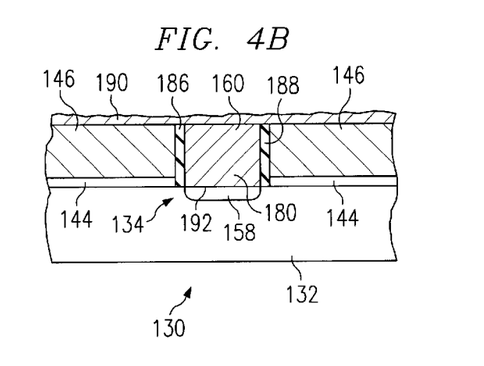
FIG. 4B is a side view of the transistor structure of FIG. 4A.

FIGS. 4A and 4B illustrate top and side views, respectively, of transistor structure 130 including a gate-to-body contact 180 formed according to the methods shown in FIGS. 3A–3B, with the addition of sidewalls to space gate-to-body contact 180 from active source and drain regions 136 and 138. As shown in FIGS. 4A and 4B, transistor structure 130 may include sidewalls 182 and 184 on opposite sides of trench 142 and separating gate-to-body contact 180 from active source and drain regions 136 and 138, and sidewalls 186 and 188 separating gate-to-body contact 180 from gate material 146.

As shown in FIG. 4A, sidewalls 182 and 184 may operate to provide space between a contact portion 192 of gate-to-body contact 180 and active source and drain regions 136 and 138 such that current running from contact material 160 to body region 134 is not being shorted by active source region 136 or active drain region 138.

Sidewalls 182–188 may be formed from a dielectric or a conductive material. In some embodiments, sidewalls 182–188 comprise one or more conductive materials such that a voltage may be applied from gate material 146 to body region 134 through sidewalls 186 and 188 and through contact material 160. In other embodiments, sidewalls 182–188 are formed from dielectric or non-conductive materials such that electricity cannot readily pass through sidewalls 186 and 188. In one embodiment in which a non-conductive material is used to form sidewalls 182–188 as shown in FIG. 4B, a conductive layer 190 (such as silicon or a silicide, for example) is deposited or grown adjacent gate material 146 and contact material 160 to provide a conductive bridge over sidewalls 186 and 188. Thus, a voltage may be applied from gate material 146 to body region 134 via conductive layer 190 and contact material 160.

Figure 5:
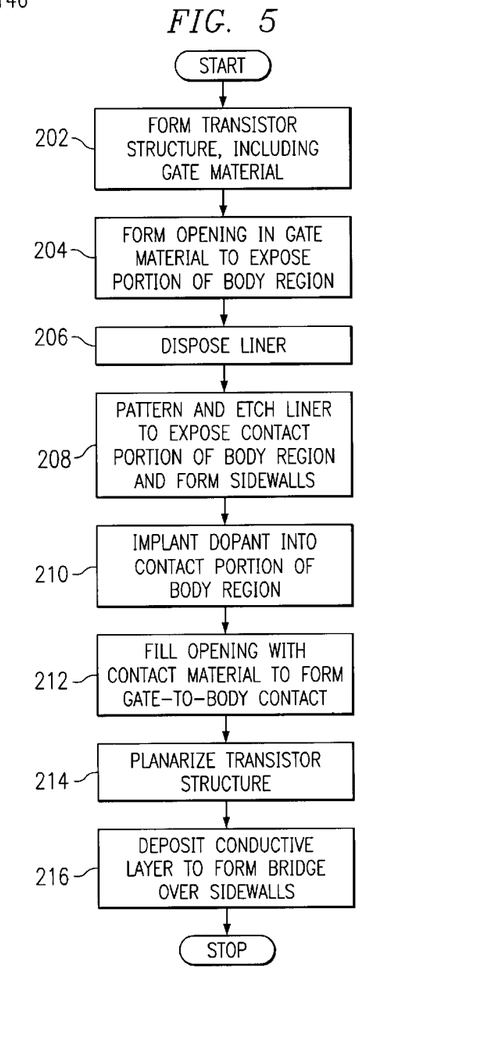
FIG. 5 is a flow chart illustrating a method of forming the transistor structure of FIG. 4A and 4B.

FIG. 5 illustrates a method of forming a transistor structure having a gate-to-body contact and a number of sidewalls. At step 202, a transistor structure (for example, transistor structure 130) is formed, including a substrate (for example, substrate 132), an active source region (for example, active source region 136), an active drain region (for example, active drain region 138), a body region (for example, body region 134), a dielectric layer (for example, dielectric layer 140), a gate dielectric layer (for example, gate dielectric layer 144), and a gate material (for example, gate material 146). At step 204, an opening in the gate material is patterned and etched to expose a portion of the body region. A stacked etch may be used to remove the appropriate portions of the gate material and the gate dielectric layer.

At step 206, a liner is disposed over the dielectric layer and gate material and extends into the opening formed at step 204. The liner may be formed from a conductive or a nonconductive material, depending on the application. At step 208, the liner is patterned and etched such that a contact portion (for example, contact portion 192) of the body region is exposed and sidewalls (for example, sidewalls 182–188) are formed. The contact portion may be smaller than the portion of the body region exposed at step 204. In some embodiments, the contact portion is spaced apart from the active source and drain regions by a distance approximately equal to the width of the sidewalls adjacent the active source and drain regions (for example, sidewalls 182 and 184, respectively).

At step 210, a dopant may be implanted into the contact portion of the body region, such as described above with reference to dopant 158 shown in FIG. 3A. In some embodiments, it is not necessary to implant a dopant. At step 212, the opening between the sidewalls is filled with a contact material (for example, material 160) to form a gate-to-body contact (for example, contact 180). At step 214, the transistor structure may be planarized to form a planarized surface (for example, planarized surface 162). At step 216, a conductive layer (for example, conductive layer 190) may be deposited or grown adjacent the gate material and the contact material to provide a conductive bridge over the sidewalls disposed between the gate material and the contact material (for example, sidewalls 186 and 188). In some embodiments in which the liner that forms the sidewalls is formed from a conductive material, it is not necessary to form the conductive layer at step 216.

In this manner, a gate-to-body contact is formed with surrounding sidewalls. In some embodiments, the sidewalls provide spacing between the gate-to-body contact and the active source and drain regions such that the active source and drain regions will not short an electric current running through the gate-to-body contact and the body region of the transistor structure.

Figure 6:
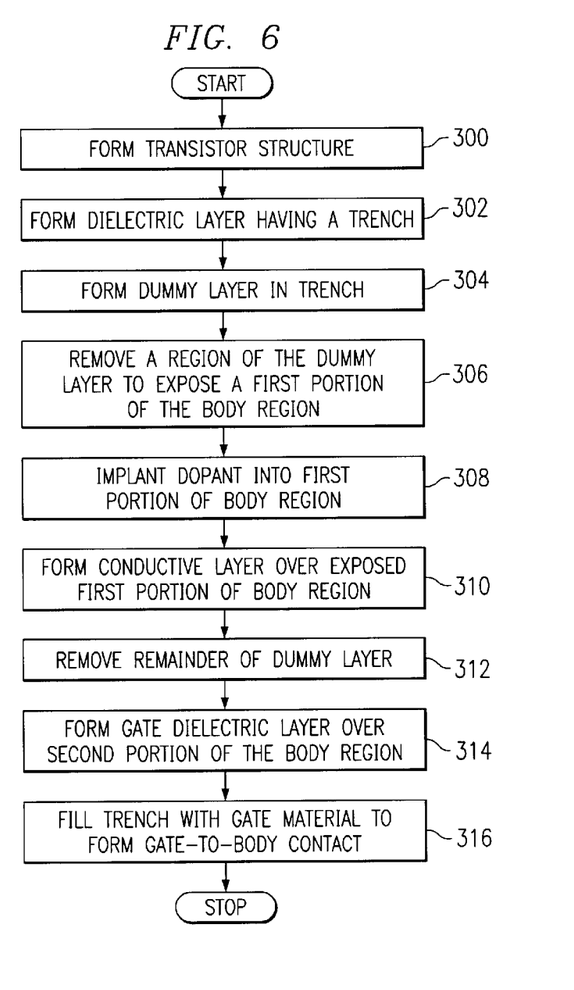
FIG. 6 is a flow chart illustrating a method of forming a gate-to-body contact in a transistor structure using a temporary or dummy layer in accordance with an embodiment of the present invention.

FIG. 6 illustrates a method of forming a gate-to-body contact in a transistor structure using a temporary or dummy layer. At step 300, a transistor structure is formed, including a substrate, and a body region separating an active source region from an active drain region. At step 302, a layer of dielectric material is deposited adjacent at least the active source and drain regions and at least partially defining a trench adjacent the body region. The layer of dielectric material and trench may be formed using various methods. For example, the trench may be formed by depositing the layer of dielectric material and etching the trench. As another example, the layer of dielectric material and trench by depositing a temporary or dummy gate, depositing a dielectric layer over the temporary gate, planarizing the dielectric layer substantially down to the thickness of the temporary gate, and removing the temporary gate.

At step 304, a temporary, or dummy, layer is formed in the trench. For example, in one embodiment, a dummy gate dielectric layer is formed in the trench and adjacent the body region. At step 306, a region of the temporary layer is removed, for example by a pattern and etch process, to expose a first portion of the body region. At step 308, the first portion of the body region is implanted with a dopant to increase the dopant concentration of the first portion of the body region. In an alternative embodiment, the dopant is implanted through the temporary layer before the region of the temporary layer is removed at 306. At step 310, a silicide layer is formed, for example by depositing or growing a silicide layer, on the exposed first portion of the body region. In some embodiments, the silicide layer is separated from the active source and drain regions such that once the gate material is filled in (as discussed below at step 316), the contact portion of the gate material will not directly contact either the source region or the drain region. For example, the silicide layer may be separated from the active source and drain regions using one or more methods described above with reference to FIGS. 1A–1E and 4A–4B. At step 312, the remainder of the temporary layer is removed, for example by a pattern and etch process.

At step 314, a gate dielectric layer is formed adjacent a second portion of the body region, for example by depositing or growing a gate dielectric layer. In one embodiment, the second portion of the body region is the portion of the body region in the trench and not covered by the silicide layer formed at step 310. At step 316, the trench is filled with a gate material such that a contact portion of the gate material is in direct contact with the silicide layer.

As discussed above with reference to step 308, in some embodiments sidewalls may be formed such that the area of contact between the silicide layer and the gate material is spaced away from the active source and drain regions. For example, a liner may be formed over at least a portion of the layer of dielectric material and extends into the trench before removing the region of the temporary layer to expose the first portion of the body region. In one embodiment, the liner is formed from one or more conductive materials, such as conductive layer 30 described above with reference to FIG. 1B. A region of the liner extending into the trench may then be removed to expose a portion of the temporary layer. In some embodiments, removing the region of the temporary layer to expose the first portion of the body region at step 306 comprises removing a region of the exposed portion of the temporary layer.

Figure 7:
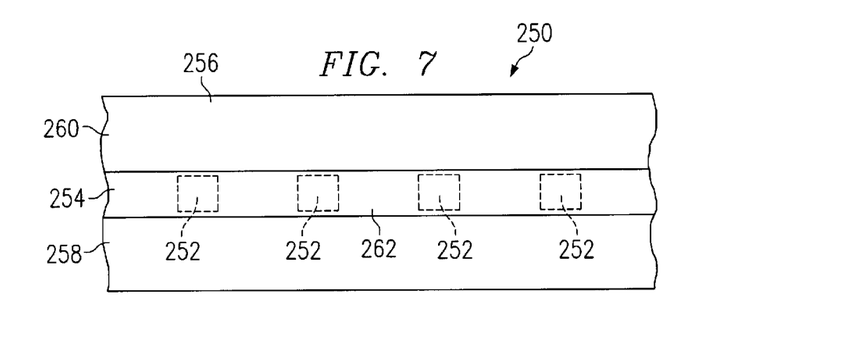
FIG. 7 is a top view of a transistor structure having multiple gate-to-body contacts formed according to one or more of the methods shown in FIGS. 1 through 6.

FIG. 7 illustrates a transistor structure 250 having multiple gate-to-body contacts 252. Gate-to-body contacts 252 may be formed by any one or more of the methods described in FIGS. 1–6 above. Transistor structure 250 may comprise a gate 254 disposed adjacent a dielectric layer 256, which may substantially cover an active source region 258 and an active drain region 260. Active regions 258 and 260 may be separated by a body region 262 that may be substantially covered by gate 254, such as shown in FIG. 3A. In some embodiments, body region 262 may have a relatively high electrical resistance and thus multiple gate-to-body contacts 252 may be formed to increase control of the voltage applied to body region 262. Gate-to-body contacts 252 may be spaced at regular intervals along gate 254 or in any other suitable manner in order to achieve desired control of the voltage in body region 262.

FIGS. 8A–8D illustrate a method of forming a general body contact in a transistor structure. The body contact may be used to connect the body of a transistor structure to various other components of the transistor structure or integrated circuit. In some embodiments, the body contact is self-aligned with a gate trench and is formed entirely within the gate region and thus takes up little or no additional space in the device.

Figure 8A:
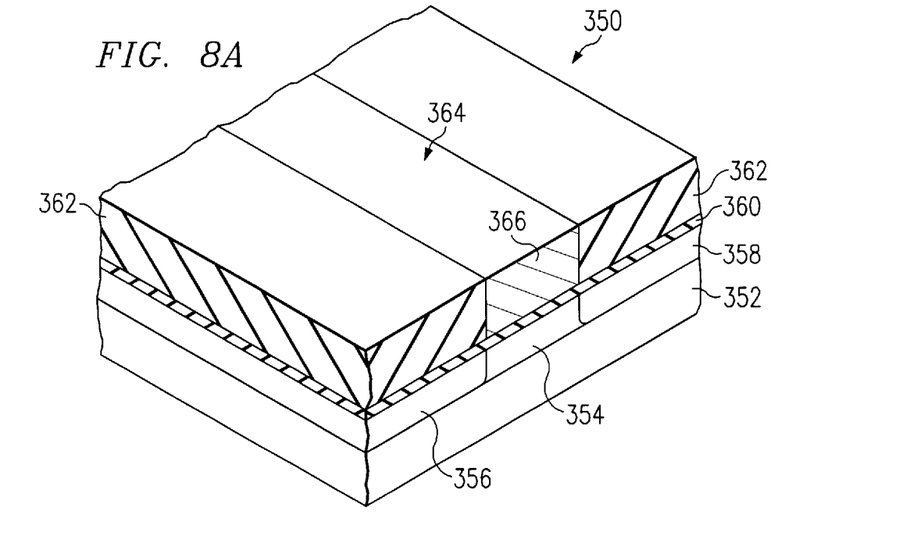
FIGS. 8A through 8D are partial three-dimensional views illustrating a method of forming a general body contact in a transistor structure in accordance with an embodiment of the present invention.

As shown in FIG. 8A, a transistor structure 350 includes a substrate 352 and a body region 354 disposed between an active source region 356 and an active drain region 358. Transistor structure 350 may be similar to transistor structure 10 described above. For example, transistor structure 350 may comprise an appropriate structure for an SOI transistor or any other type of transistor. Transistor structure 350 may also include a gate dielectric layer 360 and a dielectric layer 362 at least partially defining a trench 364, which may be similar to dielectric layer 24 and trench 26. A gate 366 may be formed in trench 364. In one embodiment, gate 366 is formed using a damascene approach. However, gate 366 may be formed using any other suitable technique without departing from the scope of the present invention.

Figure 8B:
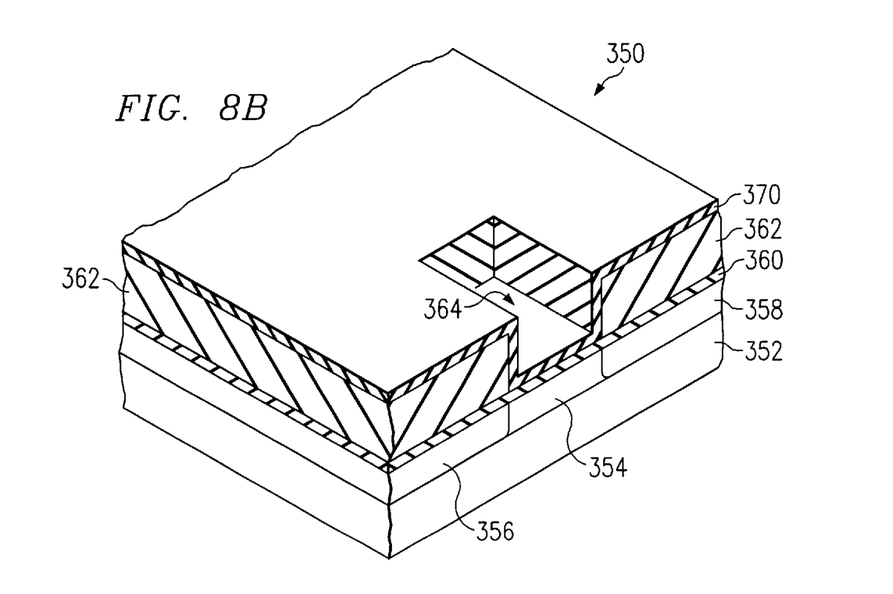

As shown in FIG. 8B, a portion of gate 366 is removed, for example using a pattern and etch process, to expose a first portion of trench 364. A non-conductive liner 370 is deposited over dielectric layer 362 and a remaining portion of gate 366 and extending into trench 364. In some embodiments, the liner is formed from dielectric materials or materials having low electrical conductivity.

Figure 8C:
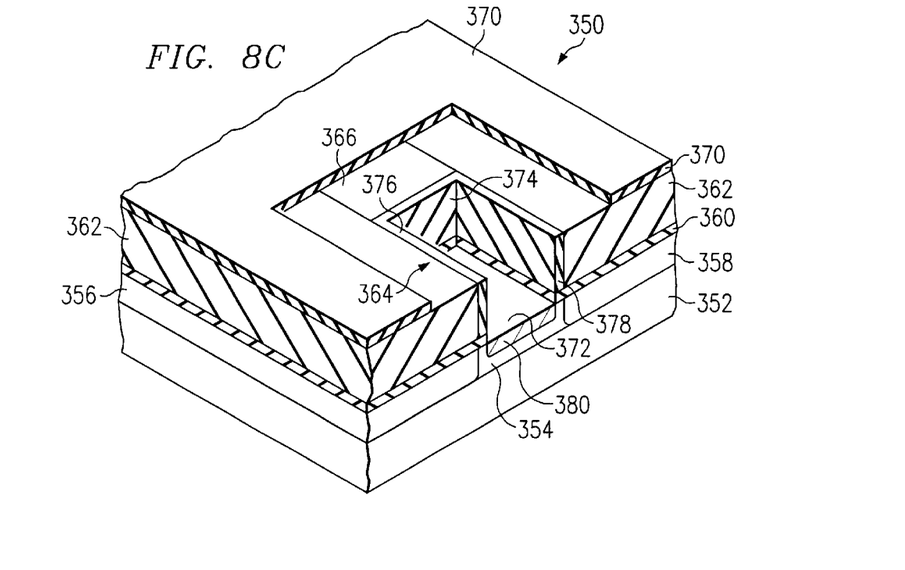

As shown in FIG. 8C, a portion of liner 370, as well as the portion of gate dielectric layer 360 covered by that portion of liner 370, may be removed to expose a contact portion 372 of body region 354. In one embodiment, the portion of liner 370 is removed to expose a first portion of gate dielectric layer 360 using a first etching process, and the exposed first portion of gate dielectric layer 360 is then removed using a second etching process. In another embodiment, the portion of liner 370, as well as the portion of gate dielectric layer 360 covered by that portion of liner 370, are removed using a single etching process.

In addition, as shown in FIG. 8C, liner 370 forms a sidewall 374 between gate 366 and the opening in trench 364, as well as sidewalls 376 and 378 on opposing sides of trench 364. In some embodiments, sidewalls 376 and 378 operate to space contact portion 372 away from active regions 356 and 358. In addition, in some embodiments, a dopant 380 is implanted into contact portion 372 such as described above with reference to FIGS. 1D, 3A and 4B.

Figure 8D:
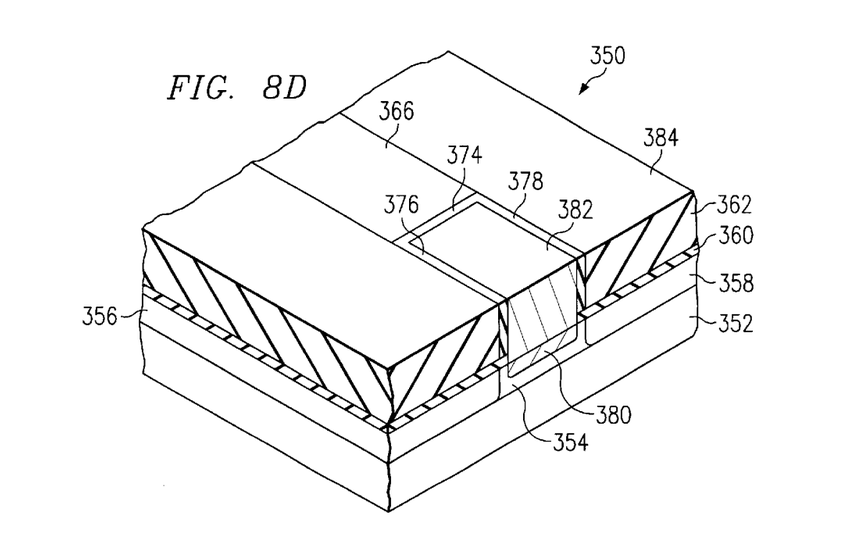

As shown in FIG. 8D, the opening in trench 364 is filled with a conductive contact material to form a body contact 382 such that a contact portion of the contact material is in direct contact with contact portion 372 of body region 354. The contact material may be the same or different material than that used to form gate 366. Transistor structure 350 may be planarized to remove portions of liner 370, gate 366 and body contact 382, and/or portions of dielectric layer 362 to form planarized surface 384.

Body contact 382 thus provides a direct contact to body region 354 and is substantially insulated from gate 366 by sidewall 374. In addition, in some embodiments, the contact portion of body contact 382 is spaced away from active regions 356 and 358 such that an electrical current running through body contact 382 and body region 354 will not be shorted by active regions 356 or 358. Body contact 382 may be connected to various components of transistor structure 350 or an integrated circuit in which transistor structure 350 is included. For example, body contact 382 may be connected to structures formed in one or more metalization layers, such as a bit line, word line, or a power supply line. In some embodiments, body contact 382 is connected to appropriate components in order to control the voltage of body region 354 during one or more operational modes of transistor structure 350.

Although an embodiment of the invention and its advantages are described in detail, a person skilled in the art could make various alternations, additions, and omissions without departing from the spirit and scope of the present invention as defined by the appended claims.

What is claimed is:

1. A method of forming an electrical contact, comprising:
   forming a gate dielectric layer adjacent a body region of a transistor structure;
   forming a layer of dielectric material at least partially defining a trench adjacent the body region;
   forming a conductive layer extending into the trench;
   removing a region of the portion of the conductive layer extending into the trench to expose a region of the gate dielectric layer;
   removing the exposed region of the gate dielectric layer to expose a contact portion of the body region; and
   filling the trench with a gate material such that a contact portion of the gate material is in direct contact with the contact portion of the body region.

2. The method of claim 1, further comprising doping the contact portion of the body region to improve the electrical contact between the contact portion of the gate material and the contact portion of the body region.

3. The method of claim 1, wherein the body region has an associated dopant concentration, and wherein the method further comprises doping the contact portion of the body region to increase the dopant concentration of the contact portion of the body region.

4. The method of claim 3, wherein the step of doping the contact portion of the body region occurs after the contact portion is exposed.

5. The method of claim 3, wherein the step of doping the contact portion of the body region occurs before the region of the conductive layer is removed.

6. The method of claim 1, wherein removing the region of the conductive layer forms a first sidewall on a first side of the trench and a second sidewall on a second side of the trench opposite the first side, such that the contact portion of the body region exposed by removing the region of the conductive layer and the region of the gate dielectric layer has a width approximately equal to the distance between the first and second sidewalls.

7. The method of claim 1, wherein:
   the body region is disposed between a source region and a drain region; and
   the contact portion of the body region is separated from the source region and the drain region such that the contact portion of the gate material does not directly contact either the source region or the drain region.

8. The method of claim 1, wherein the conductive layer comprises the same material as the gate material.

9. The method of claim 1, wherein the conductive layer comprises titanium nitride.

10. The method of claim 1, further comprising:
    removing a plurality of regions of the conductive layer to expose a plurality of regions of the gate dielectric layer;
    removing each of the plurality of exposed regions of the gate dielectric layer to expose a plurality of contact portions of the body region; and
    filling the trench with a gate material such that each of a plurality of contact portions of the gate material is in direct contact with one of the plurality of contact portions of the body region.

11. The method of claim 1, wherein the gate dielectric layer is formed in the trench after the layer of dielectric material is formed.

12. A method of forming an electrical contact, comprising:
    forming a gate dielectric layer adjacent a body region of a transistor structure;
    forming a layer of dielectric material at least partially defining a trench adjacent the body region;
    forming a layer of gate material extending into the trench;
    removing a region of the gate material extending into the trench to form a cavity and expose a region of the gate dielectric layer;
    removing a portion of the gate dielectric layer to expose a contact portion of the body region; and
    filling the cavity with a contact material such that a contact portion of the contact material is in direct contact with the contact portion of the body region.

13. The method of claim 12, wherein the portion of the gate dielectric layer removed comprises the exposed region of the gate dielectric layer.

14. The method of claim 12, further comprising doping the contact portion of the body region to improve the electrical contact between the contact portion of the gate material and the contact portion of the body region.

15. The method of claim 12, wherein the body region has an associated dopant concentration, and wherein the method further comprises doping the contact portion of the body region to increase the dopant concentration of the contact portion.

16. The method of claim 12, further comprising:
    after removing the region of the gate material to expose the region of the gate dielectric layer, forming a conductive layer covering at least a portion of the layer of gate material and the exposed region of the gate dielectric layer; and
    removing a region of the conductive layer covering the exposed region of the gate dielectric layer to expose a second region of the gate dielectric layer; and
    wherein removing a portion of the gate dielectric layer to expose a portion of the body region comprises removing the second region of the gate dielectric layer.

17. The method of claim 16, wherein:
    the body region is disposed between a source region and a drain region; and
    the contact portion of the body region is separated from the source region and the drain region such that the contact portion of the gate material does not directly contact either the source region or the drain region.

18. The method of claim 12, wherein the gate dielectric layer is formed in the trench after the layer of dielectric material is formed.

19. The method of claim 12, further comprising:
    after removing the region of the gate material to form a cavity and expose the region of the gate dielectric layer, forming an insulating layer extending into the cavity;
    removing a region of the insulating layer to expose a second region of the gate dielectric layer; and after filling the cavity with a contact material, forming a conductive layer over the contact material and the gate material to provide an electrical connection between the contact material and the gate material;

wherein removing a portion of the gate dielectric layer to expose a portion of the body region comprises removing the second region of the gate dielectric layer.

20. The method of claim 19, wherein the transistor structure comprises a source region and a drain region, and wherein the contact portion of the contact material does not directly contact either the source region or the drain region.

21. A method of forming an electrical contact, comprising:

forming a layer of dielectric material at least partially defining a trench adjacent a body region of a transistor structure;

forming a temporary layer in the trench;

removing a region of the temporary layer to expose a first portion of the body region;

forming a conductive layer on the exposed portion of the body region;

removing the remainder of the temporary layer;

forming a gate dielectric layer adjacent a second portion of the body region; and filling the trench with a gate material such that a contact portion of the gate material is in direct contact with the conductive layer.

22. The method of claim 21, further comprising:

after removing a region of the temporary layer to expose a first portion of the body region, forming an insulating layer extending over the first portion of the body region; and removing a portion of the insulating layer to expose a section of the first portion of the body region; and wherein forming a conductive layer on the exposed portion of the body region comprises forming a conductive layer on the exposed section of the first portion of the body region.

23. The method of claim 21, wherein the section of the first portion of the body region exposed by removing a portion of the insulating layer is separated from a source region and a drain region of the transistor structure.

24. The method of claim 21, wherein the body region has an associated dopant concentration, and wherein the method further comprises doping the first portion of the body region to increase the dopant concentration of the first portion of the body region.

25. The method of claim 21, further comprising:

before removing the region of the temporary layer to expose the first portion of the body region, forming a conductive layer covering at least a portion of the layer of dielectric material and extending into the trench; and removing a region of the conductive layer extending into the trench to expose a portion of the temporary layer; and wherein removing a region of the temporary layer to expose a first portion of the body region comprises removing a region of the exposed portion of the temporary layer.

* * * * *